United States Patent
Zhai

(10) Patent No.: US 10,403,800 B1
(45) Date of Patent: Sep. 3, 2019

(54) REMOTE WAVELENGTH-CONVERTING MEMBER AND RELATED SYSTEMS

(71) Applicant: Luminus, Inc., Sunnyvale, CA (US)

(72) Inventor: Jinhui Zhai, Union City, CA (US)

(73) Assignee: Luminus, Inc., Sunnyvale, CA (US)

( * ) Notice: Subject to any disclaimer, the term of this patent is extended or adjusted under 35 U.S.C. 154(b) by 0 days.

(21) Appl. No.: 15/897,567

(22) Filed: Feb. 15, 2018

(51) Int. Cl.
*F21K 9/64* (2016.01)
*F21V 23/00* (2015.01)
*H01L 33/50* (2010.01)
*H01L 33/64* (2010.01)

(52) U.S. Cl.
CPC .............. *H01L 33/504* (2013.01); *F21K 9/64* (2016.08); *F21V 23/005* (2013.01); *H01L 33/64* (2013.01)

(58) Field of Classification Search
CPC ..... H01L 33/502; H01L 33/50; H01L 33/504; H01L 33/64; F21K 9/64; F21V 23/005
See application file for complete search history.

(56) References Cited

U.S. PATENT DOCUMENTS

2007/0263678 A1* 11/2007 Mizuuchi et al. . G02B 27/0006
372/22

* cited by examiner

*Primary Examiner* — Jasmine J Clark
(74) *Attorney, Agent, or Firm* — Wolf, Greenfield & Sacks, P.C.

(57) ABSTRACT

Systems including light-emitting diodes (LEDs) are provided. The systems include one or more wavelength-converting member(s) that is/are remote from the emission surface of one or more LED-based light source(s). The wavelength-converting member may be separated from the emission surface of a first LED and positioned such that light emitted from the first LED is absorbed by the wavelength-converting material. The wavelength-converting material emits secondary light having a different wavelength than the wavelength of the light emitted from the first LED. The systems may include a second light source comprising a second LED configured to emit light having a wavelength from an emission surface and a wavelength-combining element configured to combine the secondary light from the wavelength-converting member and the light emitted from the second light source to form a co-axial light beam.

24 Claims, 4 Drawing Sheets

US 10,403,800 B1

REMOTE WAVELENGTH-CONVERTING MEMBER AND RELATED SYSTEMS

TECHNICAL FIELD

The present invention relates to light-emitting devices (e.g., LEDs) including systems (e.g., light projection engines) that comprise LEDs and remote wavelength-converting members.

BACKGROUND

Light-emitting diodes (LEDs) often can provide light in a more efficient manner than an incandescent light source and/or a fluorescent light source. LEDs are often used in connection with wavelength-converting materials (e.g., luminescent materials) which absorb light emitted by the LED and emit light having a different wavelength. As a result, wavelength-converting materials may enable light generation at wavelengths that otherwise would not be possible in LED-based systems without such materials.

Certain conventional techniques involve positioning wavelength-converting materials directly on top of the LED die. In some cases, such positioning can lead to a number of drawbacks (e.g., light back-scattering loss and thermal problems) which can negatively impact performance of the LED. For example, light back-scattering loss reduces light extraction and can generate heat within the LED that can lead to higher junction temperatures. The heat may be accumulated in the wavelength-converting material causing thermal degradation and also can reduce luminescent quantum efficiency.

Other conventional techniques have involved positioning the wavelength-converting material away from the LED die at a certain distance separated by an air gap to form a cavity. However, such techniques still may suffer from the loss of light re-entering the LED die and the wavelength-converting material may suffer significant heating issues which can lead to thermal degradation. The air cavity may also increase the light source etendue, which will reduce the light coupling efficiency.

Accordingly, improved light emitting systems and methods that use wavelength-converting material are needed.

SUMMARY

Systems and methods that include LEDs and remote wavelength-converting members are described.

In one aspect, a system is provided. The system includes a first light source comprising a first LED configured to emit light having a wavelength from an emission surface. The system further includes a wavelength-converting member comprising a wavelength-converting material on a substrate. The wavelength-converting member is separated from the emission surface of the first LED and positioned such that light emitted from the first LED is absorbed by the wavelength-converting material and the wavelength-converting material emits secondary light having a different wavelength than the wavelength of the light emitted from the first LED. The system further includes a second light source comprising a second LED configured to emit light having a wavelength from an emission surface. The system further includes a wavelength-combining element configured to combine the secondary light from the wavelength-converting member and the light emitted from the second light source to form a co-axial light beam.

Certain embodiments are related to a method. The method comprises emitting a primary light having a wavelength from an emission surface of a first LED, absorbing the primary light by a wavelength-converting material that is separated from the emission surface of the first LED, emitting a secondary light from the wavelength-converting material, the secondary light having a different wavelength than the wavelength of the primary light, emitting a light from a second LED, and combining the light emitted from the second LED with the secondary light to form a co-axial light beam.

Other aspects, embodiments and features of the present invention will become apparent from the following detailed description of various non-limiting embodiments of the invention when considered in conjunction with the accompanying figures. In cases where the present specification and a document incorporated by reference include conflicting and/or inconsistent disclosure, the present specification shall control.

BRIEF DESCRIPTION OF THE DRAWINGS

Non-limiting embodiments of the present invention will be described by way of example with reference to the accompanying figures, which are schematic and are not intended to be drawn to scale. In the figures, each identical or nearly identical component illustrated is typically represented by a single numeral. For purposes of clarity, not every component is labeled in every figure, nor is every component of each embodiment of the invention shown where illustration is not necessary to allow those of ordinary skill in the art to understand the invention. In the figures.

DETAILED DESCRIPTION

Systems including light-emitting diodes (LEDs) and related methods are provided. The systems include one or more wavelength-converting member(s) that is/are remote from the emission surface of one or more LED-based light source(s). The member includes a wavelength-converting material (e.g., luminescent material such as phosphor) layer on a substrate (e.g., metal). The wavelength-converting material absorbs primary light emitted from an LED and emits secondary light having a different wavelength than the primary light. As described further below, the substrate may be both highly thermally conductive and reflective. Advantageously, the reflectivity of the substrate can significantly reduce back-scattering losses by reflecting secondary light emitted by the wavelength-converting material. Also, the conductivity of the substrate can effectively dissipate heat generated by the wavelength-converting material which can significantly reduce thermal degradation problems. As described further below, the secondary light emitted from the wavelength-converting material may be combined with light emitted from one or more additional light sources (e.g., one or more additional LEDs) to produce combined light having a desired wavelength. The combined light may be directed along an optical pathway and, for example, projected onto a display (e.g., micro-display) panel.

Figure 1:
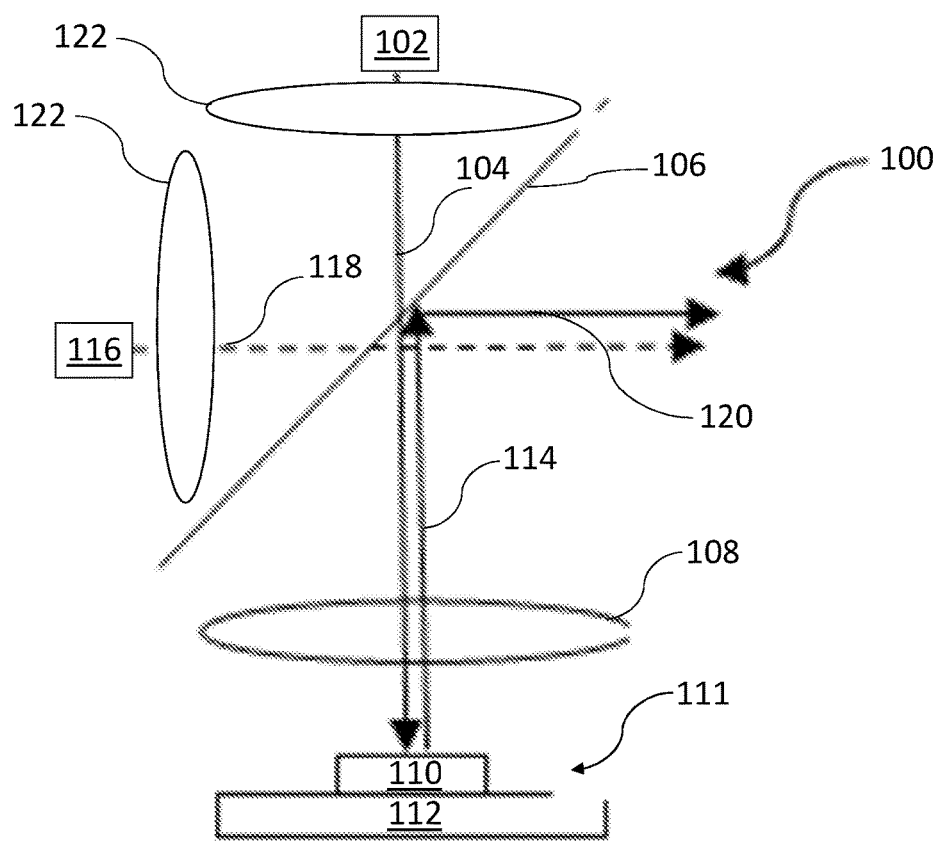
FIG. 1 shows, according to certain embodiments, a system that includes a wavelength-converting member remote from an LED-based light source.

FIG. 1 illustrates a light emitting system 100 which can function as a light engine according to some embodiments. The system includes a first LED-based light source 102 that is configured to emit primary light 104 which travels along an optical pathway in the direction of a wavelength-converting member 111. In some embodiments and, as shown, the primary light passes through (e.g., at an incident angle of 45 degrees) a wavelength-combining element 106 and/or optics element 108 prior to impinging on the wavelength-converting member. The wavelength-converting member includes a wavelength-converting material layer 110 on a substrate 112. As described above, the wavelength-converting material absorbs the primary light and emits secondary light 114 having a different wavelength than the primary light. In this illustrative embodiment, the secondary light passes through optics element 108 and impinges on the wavelength-combining element where the secondary light is combined with light 118 emitted from a second LED-based light source 116. In this embodiment, light 118 also passes through an optics element 122 upstream of the wavelength-combining element. The wavelength combining element is configured to combine secondary light 114 and light 118 to form a co-axial light beam 120. As described further below, the co-axial light beam may be further manipulated as desired (e.g., combined with other light beams) and, in some embodiments, may be projected onto a display panel (e.g., a micro-display panel).

Light sources 102, 116 may be LED-based light sources. That is, the light emitted from the source(s) is generated by an LED. It should be understood that any suitable LED may be used. For example, the LED may comprise a light generating region that comprises one or more semiconductor materials such as III-V semiconductor materials (e.g., gallium-nitride materials). In some embodiments, the LED(s) generate light having a wavelength in the blue region of the visible spectrum. In some embodiments, the light source(s) include a single die and, in other embodiments, the light source(s) include an array of more than one die. The one or more die may be mounted on a package using conventional techniques. In some embodiments, each light source in the system may include the same type of LED; while, in other embodiments, the light sources in the system may include different types of LEDs.

As described above, the wavelength-converting member includes a wavelength-converting material and a substrate. In some cases, it is preferable for the wavelength-converting material to be attached directly on the substrate. Such a configuration is conducive to transferring heat from the wavelength-converting material to the substrate.

In some cases, the wavelength-converting material is attached to the substrate using an interface material, e.g., an adhesive and/or an epoxy. The interface material, when present, should be selected so as to not disrupt the function of the substrate to reflect light emitted by the wavelength-converting material and to conduct heat from the wavelength-converting material. According to certain embodiments, the interface material, when present, is clear and/or transparent to primary light and secondary light. In some embodiments, the interface material is thermally conductive and can aid in dissipating heat generated within the LED. In some cases, the interface material is silicone. In certain embodiments, the interface material is KER-3000-MS or X-32-2551, both sold by Shin-Etsu Chemical Company (Japan). The interface material may be in the form of a layer and the layer may have any of a variety of suitable thickness ranges. For example, according to certain embodiments, the interface material layer has a thickness of between 5 microns to 1000 microns, between 25 microns to 75 microns, or between 50 to 75 microns.

In some embodiments, the wavelength-converting material is in the form of a layer (e.g., planar layer). The layer may be continuous or discontinuous (e.g., in the form of islands). The layer may be a plate (e.g., a ceramic), or a film, or a slurry coating that is separately manufactured and attached to the metal substrate. When the wavelength-converting material is a slurry coating, it may be formed directly on the substrate with no interface material being present.

As described above, the wavelength-converting material is a luminescent material which can absorb primary light and emit secondary light at a different wavelength. For example, the luminescent material may absorb primary light having relatively short wavelength (e.g., blue light) and emit secondary light having a longer wavelength (e.g., green light, red light). Examples of suitable luminescent materials include phosphors. Any suitable phosphor material may be used. In some embodiments, the phosphor material may be a yellow phosphor material (e.g., $(Y,Gd)(Al,Ga)G:Ce^{3+}$, sometimes referred to as a "YAG" (yttrium, aluminum, garnet) phosphor), a red phosphor material (e.g., wide bandwidth red nitride phosphor, narrow bandwidth red nitride phosphor such as KSF phosphor, $Eu^{2+}/Mn^{4+}$ doped red phosphor), a green phosphor material (e.g., ZnS:Cu,Al, Mn, $Lu_3Al_5O_{12}:Ce^{3+}$ (LuAG)), and/or a blue phosphor material.

In some embodiments, the wavelength-converting material may be in the form of quantum dots. The quantum dots can be distributed in a second material (e.g., an encapsulant or adhesive, such as epoxy, or an insulator, such as glass) to form a composite structure. For example, the quantum dots can be formed of group IV semiconductors (e.g., silicon, germanium), III-V semiconductors, II-VI semiconductors, and combinations thereof. In some embodiments, the quantum dots are red-emitting CdSe/CdS core/shell quantum dots and/or Cd-free quantum dots.

In some embodiments (not shown), the wavelength-converting material may be protected from the environment with a protective coating to prevent degradation of the wavelength-converting material layer. For example, such a protective coating may be used when the wavelength-converting material is a red phosphor material. Any suitable coating may be used including silicone or glass.

As described above, the substrate may be reflective. For example, the substrate may reflect greater than 90% of the light incident upon the substrate. The substrate also may be highly thermally conductive to enable effective transfer of the heat generated in the wavelength-converting material.

In some embodiments, the substrate comprises a metal. Any suitable metal may be used including, for example, aluminum. The substrate may be a metal in bulk form (e.g., a block). In some embodiments, the substrate may include a reflective and/or conductive layer that is formed on another material. For example, the substrate may include a metal layer formed on a ceramic substrate. In some cases, the substrate may be thermally connected to another component such as a heat sink. In some cases, the substrate is large enough to effectively dissipate heat generated in the wavelength-converting material.

In some embodiments, the substrate may comprise a semiconductor LED die. For example, the semiconductor LED die may be configured to emit light which is absorbed by the wavelength-converting material in addition to the light emitted from first LED-based light source 102. In this embodiment, wavelength-converting material emits secondary light having a different wavelength than the wavelength of the light emitted from the first LED and the wavelength of light emitted from the semiconductor LED die substrate.

The substrate (and wavelength-converting member) may have a planar shape in some embodiments. It should be understood that other configurations may also be possible.

As described above, the wavelength-converting member(s) is/are remote from the emission surface(s) of one or more LED-based light source(s). For example, the wavelength-converting member is separated from the emission surface by at least 10 mm; in some embodiments, at least 20 mm; and, in some embodiments, at least 30 mm. In certain embodiments, the separation distance can depend on the specific configuration of the system and how it is used.

As shown in FIG. 1, the system includes several components within the optical pathway between the first light source and the wavelength-converting member. One such component is the wavelength-combining element 106. In some cases, the wavelength-combining element is transparent to certain wavelengths of light (e.g., light of wavelength less than 490 nm). The wavelength-combining element is configured to permit primary light from the first light source to transmit therethrough (e.g., at an incident angle of 45 degrees) on the optical pathway to the wavelength-converting member. For example, referring to FIG. 1, primary light 104 (e.g., blue light) is transmitted through wavelength-combining member 106. In certain embodiments, the wavelength-combining element is reflective to certain wavelengths of light (e.g., light of wavelength greater than 490 nm). The wavelength-combining element is also configured to combine the secondary light emitted from the wavelength-converting member with light (e.g., primary light) emitted from second light source 116 by reflecting the secondary light such that it is on the same optical pathway as the primary light from the second light source. The light is combined to form a co-axial light beam that is directed along a desired direction. For example, referring to FIG. 1, light 118 from second light source 116 is transmitted through wavelength-combining member 106, and secondary light 114 (e.g., green light) is reflected by wavelength-combining member 106 and combined with light 118 from second light source 116 to form co-axial light beam 120. Suitable configurations of the wavelength combining element include a substrate that is coated with a dichroic and/or multi-layer film. Other configurations may also be suitable. In some embodiments, the wavelength-combining element may be a filter.

The system includes optics element 108 positioned along the optical pathway between the first light source and the wavelength-converting member, optics element 122 positioned between light source 102 and wavelength-combining member 106, and optics element 122 positioned between the second light source 116 and the wavelength-combining member 106. In some embodiments, as light passes through the optics elements in a first direction, the optics element focuses the light. For example, in reference to FIG. 1, primary light 104 is focused after passing through optics element 108, for example, so that its beam size is matched to a surface of the wavelength-converting material, as described further below. According to other embodiments, light passing through an optics element in a direction different from the first is collimated. For example, in reference to FIG. 1, secondary light 114 is collimated after passing through optics element 108. In certain embodiments, the optics elements are configured to focus light with a suitable beam size. Control of beam size can be advantageous in matching the etendue throughout the system (including matching the etendue of a micro-display associated with the system). For example, the beam size of primary light 104 from the first light source 102 may be controlled using optics element 108 so that it matches the size and/or aspect ratio of the surface of the wavelength-converting material 110. In some embodiments, the beam size of the secondary light 114 from the wavelength-converting member matches the size of second light 118 from second light source 116. Suitable optics elements include lenses.

Figure 2:
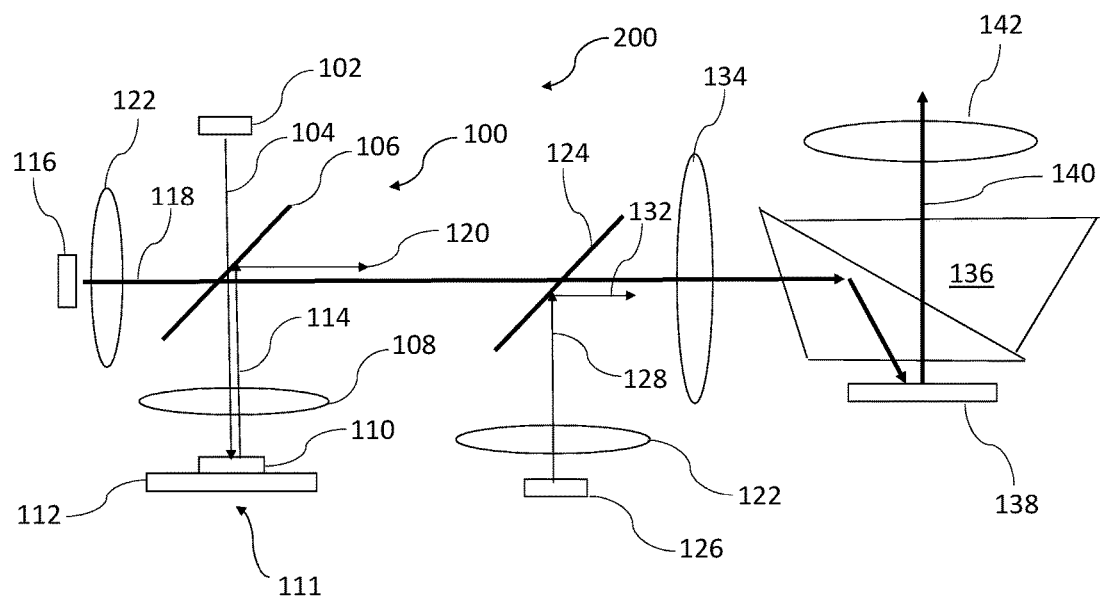
FIG. 2 shows, according to some embodiments, a light engine system that includes multiple LED-based light sources, a remote wavelength-converting member, and a micro-display panel and related optics.

FIG. 2 illustrates an embodiment of a light projection system 200. System 200 incorporates the components shown in FIG. 1 as well as additional components including a microdisplay panel and related optics, as described further below. System 200 includes a third LED-based light source 126 which emits light 128. For example, according to some embodiments, the third LED-based light source emits red wavelength light. In some embodiments, the third LED-based light source emits red wavelength light from a red wavelength-converting material (e.g., a narrow bandwidth red phosphor material) that absorbs light from an LED that, for example, may be positioned under or remote from the red wavelength-converting material.

In certain embodiments, light 128 passes through optics element 122, which collimates the light, and impinges on a second wavelength-combining element 124. The second wavelength-combining element combines light 128 with the co-axial light beam 120 (produced by the components of system 100) to form a second co-axial light beam 132. According to certain embodiments, the beam size of light 128 and co-axial light beam 120 is matched. In some embodiments, co-axial light beam 120 includes blue and green wavelength light and light 128 includes red wavelength light. In such embodiments, the second co-axial light beam 132 is a combination of red, green and blue light. For example, light emission from the different light sources may be controlled to provide the desired combination of red, green and blue light. In certain embodiments, the second co-axial light beam may appear white.

In the illustrative embodiment, the second co-axial light beam 132 passes through optional condenser optics element 134. According to certain embodiments, the condenser optics element has a beam homogenizing function.

Light projection system 200 includes a micromirror optics element 136 which projects the co-axial light beam 132 onto a micro-display panel 138 (e.g., a digital micromirror device (DMD) panel). In some embodiments, the micromirror optics element includes one or more prisms (e.g., two prisms). According to some embodiments, the second co-axial light beam is projected onto the micro-display panel with matched etendue of the micro-display panel for high light coupling efficiency. The second co-axial light beam is reflected by the micro-display panel 138 to produce output light 140. According to some embodiments, the output light passes again through the micromirror optics element 136. As illustrated, the output light enters a projection lens system 142 which projects the light as desired (e.g., on to a screen, a wall, etc.). According to certain embodiments, the projection lens system is a lens or a series of lenses (e.g., two lenses, three lenses, etc.).

Figure 3:
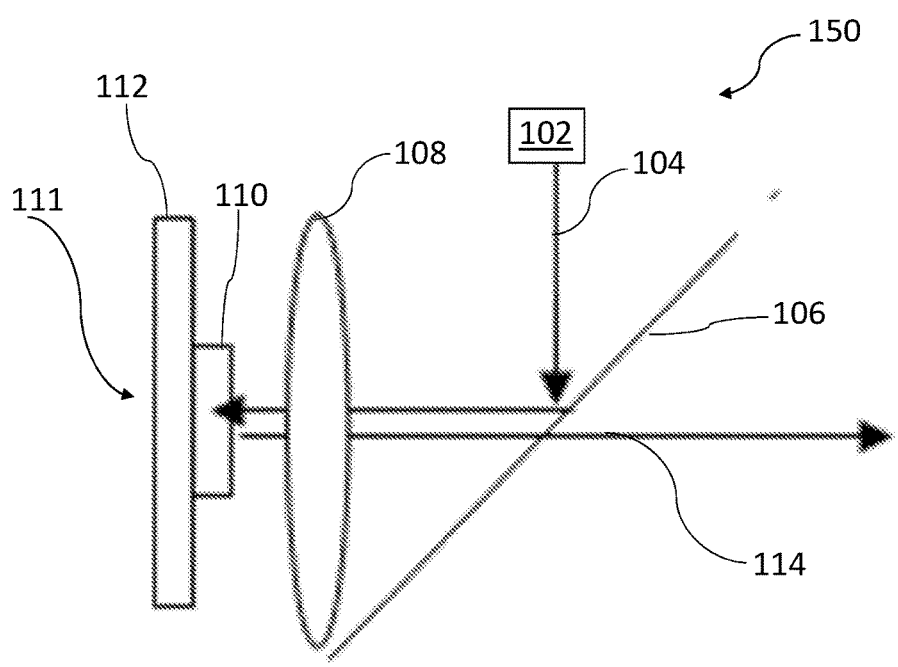
FIG. 3 shows, according to some embodiments, a system that includes an alternative configuration of a wavelength-converting member remote from an LED-based light source.

According to certain embodiments, a system may incorporate the wavelength-converting member and LED-based light source in a different configuration than shown in FIG. 1. For example, as shown in FIG. 3, the system includes a single LED-based light source 102 which emits primary light 104 (e.g., violet and/or blue light). Primary light 104 is reflected by wavelength-combining element 106 and directed toward wavelength-converting member 111 which includes wavelength-converting material layer 110 on substrate 112. In certain embodiments, the primary light passes through optics element 108 to form a beam size matching to wavelength-converting material layer 110. The primary light is converted to secondary light 114 (e.g., green light) by the wavelength-converting material as described above. The secondary light 114 passes through first optics element 108 and wavelength-combining element 106. As described further below, the secondary light 114 may be combined with light from one or more other sources in the wavelength combining element.

Figure 4:
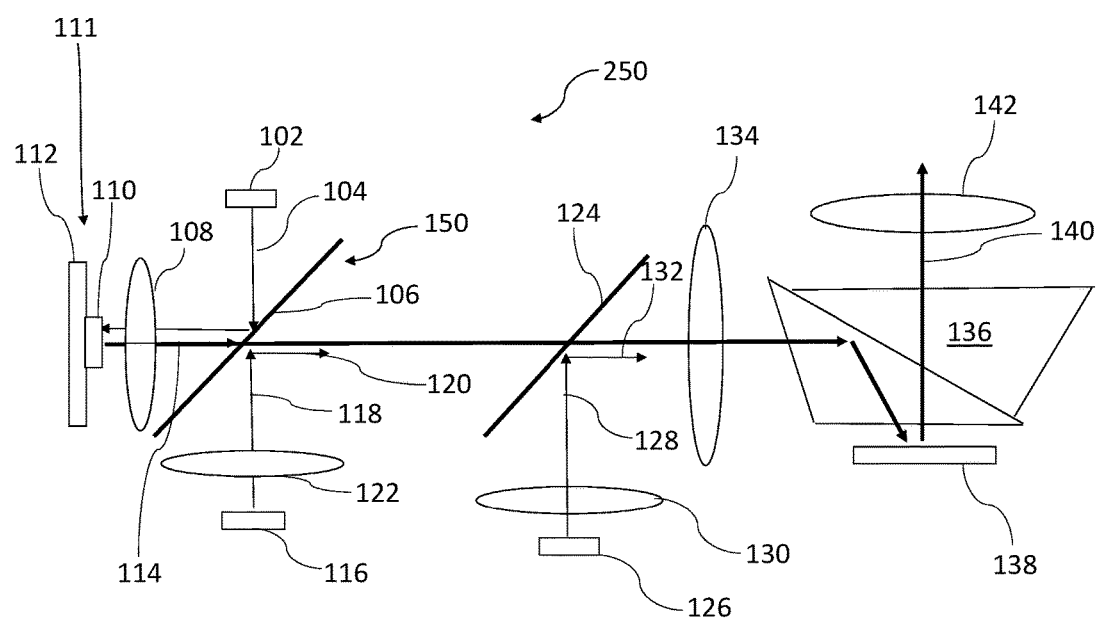
FIG. 4 shows, according to some embodiments, the configuration of a remote wavelength-converting member from an LED-based light source shown in FIG. 3 incorporated into a light engine system.

According to certain embodiments, the system of FIG. 3 may be incorporated in a light projection system 250 as shown in FIG. 4 which also incorporates additional components including additional light sources, a micro-display panel and related optics, as described further below.

System 250 includes second LED-based light source 116 which emits light 118 (e.g., blue wavelength light) which passes through optics element 108 and enters wavelength-combining element 106. Light 118 is combined with secondary light 114 in element 116 to produce a co-axial light beam 120. The co-axial light beam is directed to a second wavelength-combining element 124 which combines the co-axial light beam 120 with light (e.g., red) emitted from third LED-based light source 126 to form second co-axial light beam 132 as described above in the context of FIG. 2. According to certain embodiments, the beam size of light 118 and secondary light 114 is matched, and the beam size of co-axial light beam 120 and light 126 is matched to form co-axial light beam 132. In some embodiments, co-axial light beam 120 includes blue and green wavelength light and light 128 includes red wavelength light. In such embodiments, the second co-axial light beam 132 is a combination of red, green and blue light. For example, light emission from the different light sources may be controlled to provide the desired combination of red, green and blue light. In certain embodiments, the second co-axial light beam may appear white.

As described above in connection with FIG. 3, the second co-axial light beam 132 passes through an optional condenser optics element 134 which can homogenize the beam. In some cases, micromirror optics element 136 projects the co-axial light beam 132 onto micro-display panel 138. According to some embodiments, the second co-axial light beam is projected onto the micro-display panel with matched entendue of the micro-display panel for high light coupling efficiency. As described above in connection with FIG. 3, the second co-axial light beam is reflected by the micro-display panel 138 to produce output light 140. The output light enters a projection lens system 142 which projects the light as desired (e.g., on to a screen, a wall, etc.).

The invention claimed is:

1. A system, comprising:
 a first light source comprising a first LED configured to emit light having a wavelength from an emission surface;
 a wavelength-converting member comprising a wavelength-converting material on a substrate;
 wherein the wavelength-converting member is separated from the emission surface of the first LED and positioned such that light emitted from the first LED is absorbed by the wavelength-converting material and the wavelength-converting material emits secondary light having a different wavelength than the wavelength of the light emitted from the first LED; and
 a second light source comprising a second LED configured to emit light having a wavelength from an emission surface; and
 a wavelength-combining element configured to combine the secondary light from the wavelength-converting member and the light emitted from the second light source to form a co-axial light beam.

2. The system of claim 1, wherein the substrate comprises a metal.

3. The system of claim 1, wherein the substrate is reflective.

4. The system of claim 1, wherein the wavelength-converting material is a phosphor material.

5. The system of claim 4, wherein the phosphor material is a red phosphor material.

6. The system of claim 1, wherein the wavelength-converting material comprises quantum dots.

7. The system of claim 1, wherein the wavelength-converting material is protected by a protective coating.

8. The system of claim 1, wherein the secondary light comprises green wavelength light and the light emitted from the second light source comprises blue wavelength light.

9. The system of claim 1, wherein the substrate comprises a semiconductor LED die wherein the semiconductor LED die is configured to emit light;
 and the wavelength-converting material absorbs the light emitted from the semiconductor LED die and the light emitted from the first LED and emits the secondary light having a different wavelength than the wavelength of the light emitted from the first LED and the wavelength of light emitted from the semiconductor LED die.

10. The system of claim 1, further comprising a first optics element configured to receive light from the first light source and focus light on to the wavelength-converting member.

11. The system of claim 10, wherein the first optics element matches the beam size and/or aspect ratio of the light from the first light source to a surface of the wavelength-converting material.

12. The system of claim 10, wherein the first optics element is configured to collimate secondary light from the wavelength-converting member.

13. The system of claim 1, further comprising a second optics element configured to collimate light from the second light source.

14. The system of claim 1, further comprising a third light source comprising a third LED configured to emit light having a wavelength from an emission surface.

15. The system of claim 14, wherein the third light source is configured to emit red wavelength light having peak wavelength range of 610 nm~650 nm.

16. The system of claim 14, further comprising a second wavelength-combining element configured to combine the co-axial light beam with light emitted from the third light source to form a second co-axial light beam.

17. The system of claim 14, wherein the third light source is configured to emit red wavelength light from a red wavelength-converting material, and wherein:
 the red wavelength-converting material absorbs light emitted from the third LED and emits the red wavelength light; and the second wavelength-combining element is configured to combine the co-axial light beam with the red wavelength light to form a second co-axial light beam.

18. The system of claim 17, wherein the red wavelength-converting material absorbs the light emitted from the third LED underneath and/or the remote from the red wavelength-converting material and emits the red wavelength light.

19. The system of claim 17, wherein the red wavelength-converted material comprises a narrow bandwidth red phosphor material.

20. The system of claim 16 and claim 17, wherein the second co-axial light beam comprises red wavelength light, green wavelength light and blue wavelength light.

21. The system of claim 16 and claim 17, further comprising a micromirror optics element configured to receive and project the second co-axial light beam.

22. The system of claim 21, further comprising a microdisplay panel configured to reflect the projected second co-axial light beam to produce output light.

23. The system of claim 22, further comprising a projection lens system configured to project the output light.

24. A method, comprising:
   emitting a primary light having a wavelength from an emission surface of a first LED;
   absorbing the primary light by a wavelength-converting material that is separated from the emission surface of the first LED;
   emitting a secondary light from the wavelength-converting material, the secondary light having a different wavelength than the wavelength of the primary light;
   emitting a light from a second LED; and
   combining the light emitted from the second LED with the secondary light to form a co-axial light beam.

* * * * *